United States Patent
Oladeji

(10) Patent No.: US 8,225,744 B2
(45) Date of Patent: Jul. 24, 2012

(54) METHOD FOR FABRICATING COPPER-CONTAINING TERNARY AND QUATERNARY CHALCOGENIDE THIN FILMS

(75) Inventor: Isaiah O. Oladeji, Gotha, FL (US)

(73) Assignee: Sisom Thin Films LLC, Orlando, FL (US)

( * ) Notice: Subject to any disclaimer, the term of this patent is extended or adjusted under 35 U.S.C. 154(b) by 0 days.

(21) Appl. No.: 12/931,747

(22) Filed: Feb. 9, 2011

(65) Prior Publication Data

US 2011/0139071 A1   Jun. 16, 2011

Related U.S. Application Data

(62) Division of application No. 12/462,146, filed on Jul. 30, 2009, now Pat. No. 7,972,899.

(51) Int. Cl.
   *B05B 1/02* (2006.01)
   *B05C 11/00* (2006.01)
   *B05C 11/10* (2006.01)

(52) U.S. Cl. ......... 118/712; 118/58; 118/300; 118/305; 427/437; 427/443.1

(58) Field of Classification Search ............ 118/58, 118/712; 427/437, 443.1
   See application file for complete search history.

(56) References Cited

U.S. PATENT DOCUMENTS

| | | | |
|---|---|---|---|
| 5,595,606 A * | 1/1997 | Fujikawa et al. | ............ 118/725 |
| 6,537,845 B1 | 3/2003 | McCandless et al. | |
| 6,709,563 B2 * | 3/2004 | Nagai et al. | .................. 205/123 |
| 6,794,288 B1 | 9/2004 | Kolics et al. | |
| 7,235,483 B2 | 6/2007 | Ivanov | |
| 2002/0108565 A1 * | 8/2002 | Rose | ............................. 118/300 |
| 2003/0181040 A1 | 9/2003 | Ivanov et al. | |
| 2004/0084143 A1 | 5/2004 | Ivanov et al. | |

OTHER PUBLICATIONS

I. L. Repins et al. Comparison of device performance and measured transport parameters in widely-varying Cu(In,Ga)(Se,S) solar cells. Prog. Photovolt: Res. Appl. 14:25-43, 20, Oct. 5, 2005.
J. Ward et al. Cu(In,Ga)Se2 Thin-film concentrator solar cells. NCPV Prog. Rev. Meeting Lakewood, Colorado, Oct. 14-17, 2001. NREL/CP-520-31144.

(Continued)

*Primary Examiner* — Angel Roman
(74) *Attorney, Agent, or Firm* — Robert J. Lauf

(57) ABSTRACT

An apparatus for depositing a solid film onto a substrate from a reagent solution includes reservoirs of reagent solutions maintained at a sufficiently low temperature to inhibit homogeneous reactions within the reagent solutions. The chilled solutions are dispensed through showerheads, one at a time, onto a substrate. One of the showerheads includes a nebulizer so that the reagent solution is delivered as a fine mist, whereas the other showerhead delivers reagent as a flowing stream. A heater disposed beneath the substrate maintains the substrate at an elevated temperature at which the deposition of a desired solid phase from the reagent solutions may be initiated. Each reagent solution contains at least one metal and either S or Se, or both. At least one of the reagent solutions contains Cu. The apparatus and its associated method of use are particularly suited to forming films of Cu-containing compound semiconductors.

9 Claims, 6 Drawing Sheets

OTHER PUBLICATIONS

K. Jimbo et al. Cu2ZnSnS4-type thin film solar cells using abundant materials. Thin Solid Films 515: 5997-9, 2007.

Nanosolar Inc.; High-performance thin-film photovoltaics using low-cost process technology. 17th Int'l Photovoltaic Sci. Eng. Conf., Tokyo, Japan, Dec. 3-7, 2007.

A. F. Hepp et al. Aerosol-assisted chemical vapor deposited thin films for space photovoltaics; NASA/TM—2006-214445.

S. Messina et al. Antimony sulfide thin films in chemically deposited thin film photovoltaic cells. Thin Solid Films 515:5777-82, 2007.

S. Aksay, Structural and morphological properties of CuInS2 polycrystalline films obtained by spray pyrolysis method. J. Arts and Sci. 4:1-9, 2005.

S. Manolache et al. The influence of the precursor concentration on CuSbS2 thin films deposited from aqueous solutions. Thin Solid Films 515:5957-60, 2007.

* cited by examiner

METHOD FOR FABRICATING COPPER-CONTAINING TERNARY AND QUATERNARY CHALCOGENIDE THIN FILMS

CROSS REFERENCE TO RELATED APPLICATION

This application is a Divisional of U.S. patent application Ser. No. 12/462,146 filed by the present inventor on Jul. 30, 2009 now U.S. Pat. No. 7,972,899, the entire disclosure of which is incorporated herein by reference.

BACKGROUND OF THE INVENTION

1. Field of the Invention

The invention pertains to a system and method for chemically coating a variety of surfaces with semiconductor materials, metals, or insulators for various applications Including electronics. More particularly, the invention pertains to methods for making chalcogenide compound films containing copper, for photovoltaic devices and other applications.

2. Description of Related Art

Numerous coating processes like electroless chemical, chemical vapor, and physical vapor depositions are commonly employed in industrial applications. Physical vapor deposition is commonly used in semiconductor manufacturing applications, often employing expensive vacuum techniques in order to sustain a relatively high film growth rate. Many such processes, while performed at high temperatures (e.g., greater than 300° C.), are non-equilibrium, often resulting in non-stoichiometric proportions. Also, due to the nature of the deposition processes, the deposited films often include relatively high defect densities. In the case of semiconducting devices, such high defect levels can limit electrical performance characteristics. In semiconductor device fabrication wherein p-n junctions are formed in a partial vacuum by depositing one film over a second film or a substrate of different conductivity type, the conventional evaporative and sputtering techniques may provide unsatisfactory film qualities. As an alternative, relatively more expensive techniques such as Chemical Vapor Deposition (CVD), Molecular Beam Epitaxy (MBE), pulsed laser deposition, and atomic layer epitaxy, are useful, especially with formation of III-V compound semiconductor materials, but satisfactory deposition processes have not been available for fabrication of thin film II-VI compound semiconductor materials.

Chacogenide compound films of CuAC or Cu(AB)C [where A is In, Al, Ga, Sn, Fe, Sb or any other transition metal; (AB) is (InGa), (InAl), (ZnSn) or (CdSn), or any combination of transition metals; and C is S or Se or the combination of SSe] are p-type semiconductor materials with great importance in solar cells and other optoelectronic applications. Bringing devices based on these materials to the market has been greatly impacted by the cumbersome and poor yield of their traditional growth techniques.

The traditional techniques of growing some of these materials include the following:

Three-stage batch co-evaporation of CuInGaSe on Mo-coated substrate as practiced by the National Renewable Energy Laboratory (NREL). The first stage is the deposition of $(InGa)_2Se_3$ layer at 400° C., and reacting it with Cu and Se at 550° C. during the second stage. The third stage, similar to the first stage, consists of the evaporation of In and Ga in the presence of Se at 400° C. [1,2].

CuInGaSe fabricated on Mo-coated glass by a hybrid co-evaporation/sputtering process as taught by Energy Photovoltaics, Inc. (EPV). In this process, In and Ga are first evaporated in the presence of Se vapor. The first layer is followed by sputtered Cu, and the film is selenized in Se vapor. In the final stage, In and Ga are once again evaporated in the presence of Se [1].

Co-evaporated CuInGaSe on Mo-coated stainless steel by Global Solar Energy, Inc. The Global Solar process is essentially three-stage, in that group III atoms (In and Ga) are deposited first, then Cu, followed by enough group III atoms to bring the film to its desired stoichiometry; each of these steps is done in the presence of selenium at high temperature. Deposition is performed onto continuously advancing 36 cm 300 m rolls of stainless steel foil at high deposition rates [1].

Shell Solar Industries (SSI) approach in the fabrication of CuInGaSSe involves sputtering a stacked precursor from alloyed Cu—Ga and In targets, then selenization in $H_2Se$ at elevated temperature, followed by sulfurization in $H_2S$ at elevated temperature. The depositions and reactions are performed on 3900 $cm^2$ panes of soda-lime glass coated with a $SiO_2$ diffusion barrier and Mo back contact [1].

Two-stage batch co-evaporated CuInGaSe on Mo-coated glass by the Institute for Energy Conversion (IEC). In this process, elemental Cu, In, Ga, and Se fluxes are independently controlled to provide a Cu-rich total flux, Cu/(In+Ga)>1, at the start of the run. Then, In, Ga, and Se fluxes only are applied until the desired final composition, Cu/(In +Ga)= 0.8-0.9, is attained. The films are deposited at a 550° C. substrate temperature [1].

CuZnSnS deposited by inline-type vacuum apparatus. Here, ZnS, SnS and Cu are co-sputtered on a heated and rotated substrate in the vacuum chamber and then moved to reaction gas chamber for sulfurization using $N_2+H_2S$ (20%) and annealing around 580° C. [3].

All the above are expensive vacuum techniques; and the process involved is based mostly on the intermixing of elements constituting the material and subjecting the mixture to high temperature to form the compound. Unfortunately each of the various elemental particles does not have the same surrounding. Hence, small isolated areas will have the right material composition after anneal leading to film with non-uniform stoichiometry. Thus, the process may be good for small area deposition but poor for large area deposition needed for high yield manufacturing.

Another method of growth adopted by Nanosolar is coating a homogeneously mixed ink of nanoparticles, in this case Cu, In, Ga, and Se, with industrial wet coating techniques followed by baking and sintering to form the CuInGaSe compound [4].

International Solar Electric Technologies (ISET)'s CuInGaSSe absorber is prepared by applying a mixed oxide precursor coating on a metallized glass substrate via a non-vacuum knife coating technique. The precursor coating is deposited using a water-based ink which contains nanoparticles of mixed oxides. After drying, the precursor ink is reduced under an atmosphere of $H_2$ and $N_2$ gas mixture to obtain a uniform and a smooth coating of Cu—In—Ga alloys. The resulting alloy coating is further selenized under an atmosphere of $H_2Se$ and $H_2S$ gases [1].

Both of the foregoing methods are non-trivial, as they involve nanoparticle growth, a process which is not as cheap as one expects, because the nanoparticle growth requires expensive chemicals and takes place at extremely slow rate. This is then followed by the expensive ink formulation process. Materials grown by this method will also suffer from non uniformity due to high probability of particles not having the correct surrounding particles throughout the growth area.

Copper indium disulfide (CuInS) thin films deposited via aerosol-assisted chemical vapor deposition using single source precursors. Growth at atmospheric pressure in a horizontal hot-wall reactor at 395° C. yielded best device films as claimed by the author. Post-deposition sulfur-vapor annealing enhanced stoichiometry and crystallinity of the films. However, the single precursor is a very expensive organometallic $(PPh_3)_2Cu(SEt)_2In(SEt)_2$. The high precursor cost may not be compatible with the low cost devices like solar cells [5].

CuSbS was also deposited by traditional chemical bath deposition (CBD). This involves growing SbS first followed by CuS. A 6700 Å film took about 7 hours to grow. This slow growth rate and the accompanying waste make this process unacceptable [6].

$CuInS_2$ was equally deposited by spray pyrolysis [7]. Here they sprayed aqueous solution of 0.01M of $CuCl_2.2H_2O$, $InCl_3$, and $CS(NH_2)_2$ in a 1:1:2 (by volume) onto substrates at various temperatures of 225, 250 and 275° C. $CuSbS_2$ films were also obtained by Spray Pyrolysis Deposition [8]. Here the precursor weight ratio $(CuCl_2.2H_2O:H_2NCSNH_2:(CH_3COO)_3Sb)$ was varied between 2.57:1:5.71 and 6.86:1:5.71, at 240° C. Most of the time the film morphology is less than desirable and the electrical properties of these films are impaired by non-volatile unwanted elements left behind in the films; the films are therefore of less practical importance.

Additional background information may be found in the following references, whose numbers correspond to the respective citations in the foregoing discussion:
1. I. L. Repins et al. Comparison of device performance and measured transport parameters in widely-varying Cu(In,Ga)(Se,S) solar cells. Prog. Photovolt: Res. Appl. 14:25-43, 2006.
2. J. Ward et al. Cu(In,Ga)Se2 Thin-film concentrator solar cells. NCPV Prog. Rev. Meeting Lakewood, Colo., Oct. 14-17, 2001. NREL/CP-520-31144.
3. K. Jimbo et al. $Cu_2ZnSnS_4$-type thin film solar cells using abundant materials. Thin Solid Films 515: 5997-9, 2007.
4. Nanosolar Inc.; High-performance thin-film photovoltaics using low-cost process technology. $17^{th}$ Int'l Photovoltaic Sci. Eng. Conf., Tokyo, Japan, Dec. 3-7, 2007.
5. A. F. Hepp et al. Aerosol-assisted chemical vapor deposited thin films for space photovoltaics; NASA/TM-2006-214445.
6. S. Messina et al. Antimony sulfide thin films in chemically deposited thin film photovoltaic cells. Thin Solid Films 515:5777-82, 2007.
7. S. Aksay, "Structural and morphological properties of $CuInS_2$ polycrystalline films obtained by spray pyrolysis method. J. Arts and Sci. 4:1-9, 2005.
8. S. Manolache et al. The influence of the precursor concentration on $CuSbS_2$ thin films deposited from aqueous solutions. Thin Solid Films 515:5957-60, 2007.

OBJECTS AND ADVANTAGES

Objects of the invention include the following: providing a bath deposition apparatus capable of depositing a selected phase on a substrate while minimizing homogeneous nucleation of the same or similar phase within the bulk of the fluid bath; providing a bath deposition apparatus capable of depositing films having improved physical, chemical, optical, or electrical properties; providing a bath deposition apparatus that is more easily controlled; providing a bath deposition apparatus that uses reagents more efficiently; providing a bath deposition apparatus that allows localized heating of a relatively small volume of the bath while maintaining the remainder of the bath at a relatively lower temperature; providing a bath deposition apparatus for growing high quality mixed chalcogenide thin films; providing a bath deposition apparatus for growing mixed Cu-containing chalcogenide films suitable for photovoltaic cells; providing a method for bath deposition that is more easily controlled; providing a method for bath deposition that minimizes homogeneous nucleation within the bath; providing a method for bath deposition capable of depositing films of selected II-VI compounds, other compounds, or metals having improved properties; providing a method for bath deposition of high quality mixed Cu-containing chalcogenide films; and, providing a method for bath deposition of chalcogenide films having a graded composition. These and other objects will become apparent on reading the specification in conjunction with the accompanying drawings.

SUMMARY OF THE INVENTION

In accordance with one aspect of the invention, an apparatus for depositing a solid film onto a substrate from reagent solutions comprises:
a reservoir of a first reagent solution maintained at a first temperature at which homogeneous reactions are substantially inhibited within the first reagent solution;
a first showerhead assembly including a nebulizer configured to dispense the first reagent solution as a fine mist at the first temperature;
a reservoir of a second reagent solution maintained at a second temperature at which homogeneous reactions are substantially inhibited within the second reagent solution;
a second showerhead assembly configured to dispense the second reagent solution as a flowing stream at the second temperature;
a substrate holder configured to hold the substrate in a position to receive, in sequence, at least a portion of the fine mist of the first reagent solution and at least a portion of the flowing stream of the second reagent over a selected area of the substrate, the substrate holder further including a raised structure peripheral to the selected area whereby a controlled volume of the second reagent solution may be maintained upon the substrate and replenished at a selected rate; and,
a heater disposed beneath the substrate, the heater configured to maintain the substrate at a selected temperature, higher than at least one of the first and second temperatures, at which the deposition of a desired solid phase from the first and second reagent solutions respectively may be initiated.

In accordance with another aspect of the invention, a method for depositing a solid film onto a substrate from a reagent solution comprises the steps of:
providing a supply of a first reagent solution maintained at a first temperature at which homogeneous reactions are substantially inhibited within the first reagent solution;
dispensing a fine mist of the first reagent solution from a first showerhead assembly;
positioning the substrate to receive at least a portion of the fine mist of the first reagent over a selected area of the substrate;
providing a supply of a second reagent solution maintained at a second temperature at which homogeneous reactions are substantially inhibited within the second reagent solution;
dispensing a flowing stream of the second reagent solution from a second showerhead assembly;
positioning the substrate to receive at least a portion of the flowing stream of the second reagent over a selected area of the substrate;

providing a raised structure peripheral to the selected area whereby a controlled volume of the second reagent solution may be maintained upon the substrate; and, heating the substrate and the controlled volume of the second reagent solution upon the substrate to a selected temperature, higher than at least one of the first and second temperatures, whereby deposition of a desired solid phase from the reagent solutions may be initiated.

BRIEF DESCRIPTION OF THE DRAWINGS

A clear conception of the advantages and features of the invention, and of the components and operation of exemplary systems provided with the invention, will become more readily apparent by referring to the drawings accompanying and forming part of this specification, in which like numerals designate like elements in several views. The features are not necessarily drawn to scale.

DETAILED DESCRIPTION OF THE INVENTION

There has been a need for a chemical system that can create high quality films, e.g., semiconductor films, at high formation rates, while providing a relatively uniform film thickness across the entire substrate surface over which the film is formed. In accordance with several embodiments of the invention, such a high quality semiconductor film is formed by a replacement reaction wherein the system provides a continuous or replenishable supply of chemical processing solution. In several examples, the solution reacts about the surface of a heated substrate. The substrate temperature may be controlled to exhibit a substantially uniform temperature across the surface. That is, temperature differentials along the surface over which the film is formed are limited in order to effect a substantially constant reaction rate along the surface, thereby assuring a relatively uniform film growth rate. Further, the pH and composition of the solution may be continuously monitored and maintained to improve the stability of the process and, hence, the quality of the deposited film, e.g., stoichiometry, defect density, uniformity and consistency of dopant distribution. The system may be operated above atmospheric pressure to increase the rate of film growth.

Figure 1:
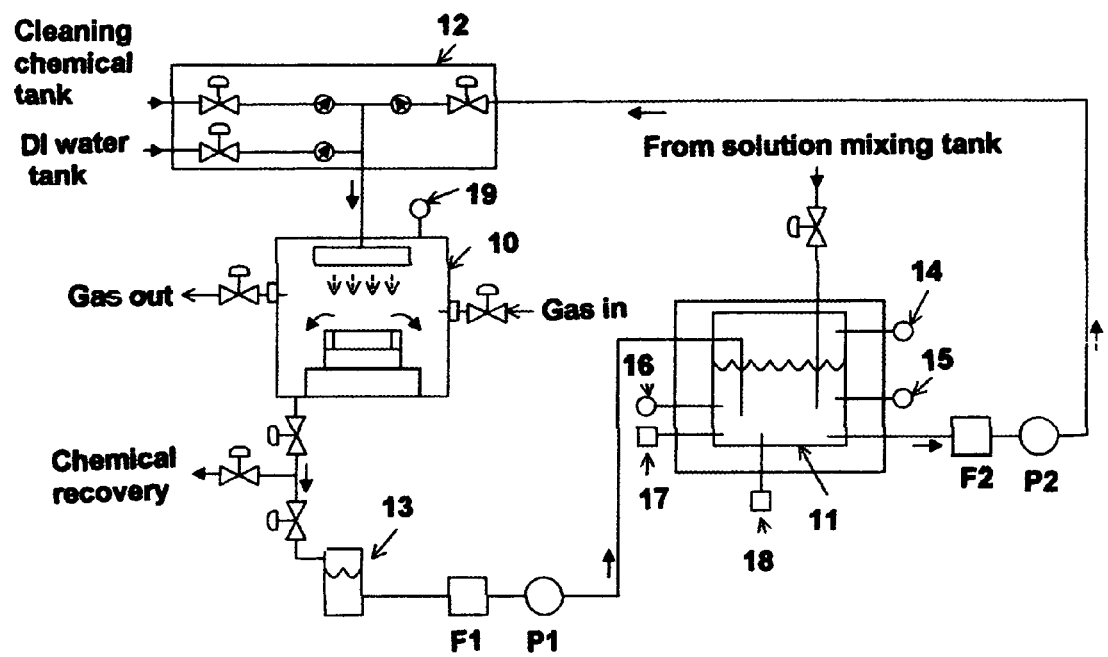
FIG. 1 illustrates schematically the general flow of reagents in accordance with one aspect of the invention.
Figure 2:
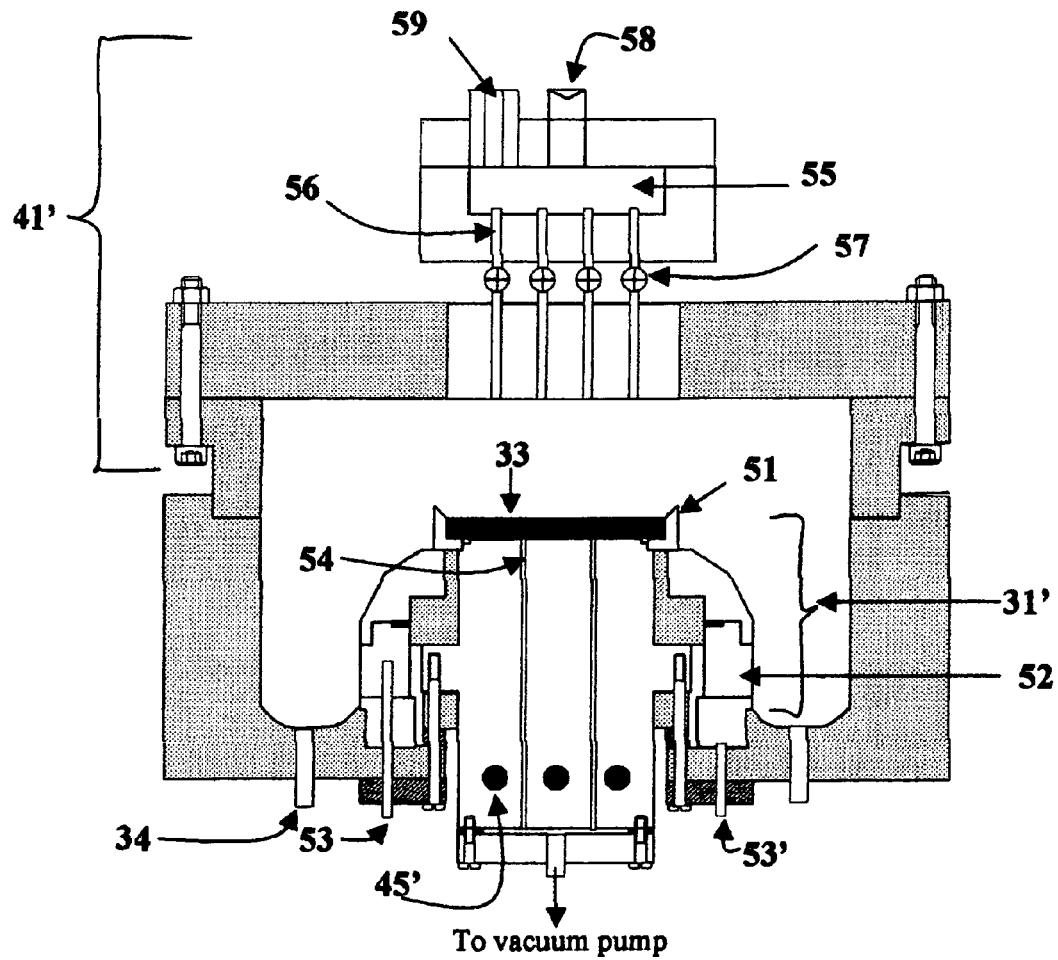
FIG. 2 illustrates schematically a vertical section of a chemical bath deposition chamber in accordance with one aspect of the present invention.

FIGS. 1-2 illustrate schematically some aspects of a Film Growth System (FGS) for conducting chemical bath deposition as taught generally in Applicant's co-pending U.S. patent application Ser. No. 12/151,562, filed on May 7, 2008, the entire disclosure of which is incorporated herein by reference. This process will be referred to herein as Liquid Phase Streaming Electroless Electrochemical Deposition (LPSPEED). Briefly, some characteristics of LPSPEED include the following: A reagent solution containing various metals and nonmetals, and various ligands to improve its stability, is held at a fairly low temperature (preferably chilled) to suppress homogeneous nucleation. This solution is dispensed through a shower head, substantially as a flowing liquid, and flows onto a substrate. The substrate is heated to a temperature sufficient to cause heterogeneous nucleation of a desired solid phase onto the surface of the substrate. In some preferred examples, additional flow of the chilled reagent solution may be used to cool other parts of the deposition apparatus to suppress homogeneous nucleation in the solution as well as heterogeneous nucleation on surfaces other than the substrate. In another examples the region outside the heater in the deposition chamber is actively cooled by an embedded cooling jacket where chilled coolant flows in and out of the jacket; this arrangement further suppresses homogeneous nucleation in the solution as well as heterogeneous nucleation on surfaces other than the substrate in the deposition chamber.

The aforementioned U.S. patent application Ser. No. 12/151,562 teaches many suitable compositions of the reagent solution adapted to deposit many different solid films.

Based on further experimentation and testing, Applicant has discovered that the earlier process may be further modified to expand its utility, to make compositionally graded films, and to generally solve many of the previously-described shortcomings in prior methods. As will be described in more detail in several Examples that follow, one aspect of the present invention includes the addition of a second showerhead comprising one or more nebulizers configured to dispense a reagent solution as a fine mist with droplets preferably less than about 50 μm and, more preferably, less than about 20 μm. A process using the nebulizer will be referred to herein as Vapor Phase Streaming Process for Electroless Electrochemical Deposition (VPSPEED)

The FGS of FIG. 1 includes a reaction chamber 10 and a chilled solution reservoir 11 for retaining and chilling chemical processing solution which may be held at a stable, low temperature preferably less than about 25° C. and more preferably in the range of 10 to 25° C. or lower. At the preferred temperatures, homogeneous reactions are substantially inhibited and the solution has adequate shelf life and minimal homogeneous precipitation of particulates. The FGS further includes a solution supply subsystem for moving the chemical processing solution (while maintained at a low temperature) from the reservoir to the chamber, and a solution return subsystem for cycling partially spent solution from the chamber back to the solution reservoir. The solution supply subsystem includes a supply line filter F2 for removing particulates from the solution, a supply line pump P2 for supplying the solution to the reaction chamber, and a liquid control panel 12 under the direction of a system controller. The liquid control panel 12 includes a series of conventional valves and flow controllers for selectably injecting and varying flows of liquids into the processing chamber 10. For example, the liquid control panel 12 may deliver the chemical processing solution and one or more chemicals for chamber cleaning or for cleaning of the surface of the substrate over which a desired film is grown.

Chemical processing solution from the reservoir is supplied to the liquid control panel by the supply line pump after passing through the supply line filter F2. The solution return subsystem includes a plurality of valves for controlling flows of various liquids from the processing chamber, a return line reservoir 13, a return line filter F1 for removing particulates from the returning solution, and a return line pump P1 for sending the filtered solution to the process solution reservoir 11. Proper control and regulation of the liquid flowing through the liquid control panel is effected by the flow controllers under the direction of the system controller. Solution reservoir 11 may optionally include such familiar components as high and low level switches 14, 15, temperature sensor 16, pH meter 17, and chemical analyzer 18.

The reaction chamber 10 illustrated schematically in FIG. 2 includes a substrate holder assembly 31', which may include mechanical clamps (not shown) or a vacuum chuck (as shown) arranged to secure substrate 33, a delivery system that includes a showerhead 41' for supplying and distributing processing solution within the chamber and over substrate (workpiece) 33. The substrate holder assembly 31' comprises an insulative housing, which may include an embedded cooling jacket, with a heater block 45' formed therein. A lip or ring structure 51 surrounds substrate 33 in order to impound a selected volume of the film-forming reagent solution. The combination of the heater block and an upper insulative surface (over which a substrate is placed) is referred to herein as a platen. Various of these components may have circular or rectangular shapes, but the functionality of the reaction chamber is not limited to these example geometries. In other examples the ring structure 51 may be replaced by a spacer including apertures or slots or may be replaced by several individual spaced-apart spacers wherein the separation facilitates exit flow of processing solution from the reaction region adjacent to the exposed upper substrate surface through the solution return subsystem to the chilled reservoir 11. The chamber may further include a pressure gauge, a gas inlet, a gas outlet, as shown schematically in FIG. 1, and a drain line 34 which is part of the return subsystem that directs partially spent processing solution from the chamber 10 to the reservoir 11. In this example, to minimize maintenance and extend useful life of the chamber, all chamber parts that are exposed to the chemical solution are preferably made of chemically inert material, such as polytetrafluoroethylene (PTFE) or perfluoroalkoxy (PFA), or the surfaces of such parts may be coated with a PTFE or PFA film. For example, the ring 51 (positioned about the substrate to create a shallow catch region or substrate opening for retaining flowing portions of the processing solution over the substrate surface) may be formed of a relatively rigid or a relatively soft material such as PTFE, PFA, or PFA-coated or PTFE-coated structural material. The illustrated continuous ring 51 encloses an area of the substrate surface that may be continuously, continually or periodically replenished with processing solution, as solution previously supplied from an overlying showerhead overflows or pours outward from the volume enclosed by the ring 51 and passes into the drain line 34.

It will be appreciated that the operation of ring 51 differs fundamentally from the "containment frame" of McCandless et al. in U.S. Pat. No. 6,537,845 in that McCandless contemplates a substantially static containment of a fixed volume of solution, whereas the present invention relies on continuous or periodic replenishment using chilled solution from the showerhead. Applicant uses this novel feature to further cool adjacent hardware components as well as cool the solution in areas other than the immediate deposition layer in order to more effectively suppress homogeneous nucleation.

A feature of the FIG. 1 example is that the rate of film formation, e.g., the rate of growing II-VI semiconductor materials, in the FGS is relatively high while the ratio of the volume of processing solution about the film formation surface on the substrate to the area of the film formation surface over which the film is formed is small, i.e., small relative to the corresponding ratio present in a conventional, traditional chemical bath. The foregoing statement is made with the understanding that the geometry and orientation of the substrate within a traditional chemical bath is typically different than that of the FGS since the traditional bath typically immerses the substrate in a heated vessel containing processing solution while the FGS positions and heats the substrate to receive a supply of processing solution, e.g., via a continuous or continual or periodic flow such as from above. Thus a direct comparison of such ratios is not easily ascertained. Nonetheless, according to the invention, the applicable volume-to-surface area ratio is effectively substantially smaller than that which would be present in a traditional bath, e.g., when the substrate is positioned in a horizontal or vertical orientation inside a vessel filled with processing solution or otherwise oriented with respect to a level solution surface. For operation in the FGS, the ratio of the volume of processing solution about the film formation surface of the substrate to the area of the substrate surface over which the film is formed is referred to herein as the Volume-to-Surface Area Ratio (VSAR). When the VSAR is high, a relatively small fraction of the processing solution is effectively contributing to the film formation while the remaining portion may result in formation of colloids in the bulk of the solution. In the FGS the spacer allows a limited volume of processing solution to be positioned above the substrate surface. The spacer may appear like a shallow tank, but actually serves as a temporary, periodically replenished collection region, as portions of the processing solution remain over the substrate surface for brief periods in order to effect chemical reactions along the exposed surface. The exemplary continuous spacer may be secured along the periphery of the substrate with a multi-clamp design, which allows the solution to flow over the spacer. Thus, the volume of chemical processing solution retained within the spacer confines is generally determined by the height of the spacer above the substrate, ranging, for example, between 0.1 and 10 mm. Depending on the specific process, setting of process parameters (e.g., substrate temperature, flow rate of processing solution, concentration of reactants in the solution) a spacer with a suitable or optimum height may be chosen. Due to the complexity of multiple variables, and the desire to maximize the rate of film formation, it may be necessary to experimentally determine process geometries and settings. The FGS may be programmed to deliver a continuous or periodic flow of processing solution through the shower head, or may be programmed to deliver metered volumes, to provide a uniform delivery of the solution over the film formation surface. With a continuous spacer formed over a uniformly heated substrate and a continual or periodic replenishment of processing solution over the reaction region of the substrate, a low VSAR effects a relatively uniform film growth over the entire region of film growth at a relatively high growth rate suitable for volume manufacture. Among the several examples disclosed herein, exemplary VSARs range from 0.1 to 10 mm, with exemplary corresponding film growth rates ranging from 100 to 1000 Å/minute and film thicknesses of satisfactory uniformities (e.g., less than 10 percent) may exceed several microns.

Another feature of the invention is that during the film formation process the film growth surface may be kept at a relatively high temperature while other surfaces within the reaction chamber are relatively cool. This feature can minimize or prevent formation of film on surfaces other than that of the substrate. By way of example, the temperature differential between the growth surface and other surfaces in the reaction chamber can range from 60° C. or 70° C. to 200° C. and may, for example be 140° C. The chamber pressure, the solution flow rate, and the substrate temperature may be adjusted to achieve deposition rates on the order of 500 Å/min to produce a relatively uniform film having a thickness on the order of one to five microns. The achievable uniformity (i.e., measurable based on variation in film thickness) over a film growth area of 21 cm$^2$ is generally better than 10% and in some instances better than 5%. As shown generally in FIG. 1, during operation of the FGS the processing solution passes from within the volume defined by the ring 51 to the solution return line and the associated reservoir 13 in order to be pumped back into the solution reservoir 11 for chilling and recirculation until such time that the requisite chemicals are so spent that the solution should be replaced. In the process of passing into the return line, the processing solution leaving the volume defined by the ring or spacer may join other portions of processing solution which are relatively cool. That is, such other portions of processing solution are injected through the showerhead and into regions of the chamber outside the region of the heated film growth surface such that these portions are relatively cool. The latter, relatively cool solution may mix with portions of the solution flowing from the spacer volume to facilitate temperature reduction of the heated solution, thereby limiting formation of undesirable products in the reaction chamber. The solution reservoir may include a temperature sensor 16, a chemical analyzer 18, a pH meter 17, and a pair of liquid level switches 14, 15. The temperature of the solution reservoir is controlled by the chiller and the reservoir is typically maintained at a temperature in the range of 10-25° C. A chemical analyzer 18 is connected to the solution reservoir to monitor the chemical composition of the reservoir constantly or periodically. When needed, the pre-mixed processing solution is added to the solution reservoir from a tank containing pre-mixed solution of desired concentration, although the solution may be stored in a more concentrated form and diluted upon or prior to entry into the reservoir. For example, the system controller may operate valves associated with the liquid control panel to dispense distilled (DI) water and precursor solutions directly into the reservoir for mixing in the solution reservoir. In some chemical processes, deposition rates are significantly influenced by the pH of the solution. The pH meter 17 monitors the pH of the solution bath and the pH may be adjusted under direction of the controller. Liquid level in the reservoir is controllable with first and second liquid level sensor switches. The first liquid level sensor switch 15 provides a signal to the controller when a minimum desired level of solution resides in the reservoir. The second liquid level sensor switch 14 provides a signal to the system controller when a maximum level of liquid resides in the reservoir.

The entire system may operate under direction of a system controller, which actuates numerous valves and switches in response to sensor information, e.g., signals provided by level switches. The system controller controls delivery of processing solution to the reaction chamber via the solution flowmeter and may also selectively rotate the showerhead during the chemical process. A thermocouple is provided to control the platen temperature during operation. The controller also controls delivery of pre-mixed processing solution to the solution reservoir to maintain suitable level of processing solution in the reservoir.

For periodic maintenance of the processing chamber, a chemical solution for chamber cleaning may be supplied from a cleaning chemical tank via a cleaning chemical supply line. DI water for rinsing the chamber after chamber cleaning may be supplied from a DI water tank via a DI water supply line. Delivery of cleaning chemical is controlled by a cleaning chemical supply line valve. Delivery of DI water is controlled by a DI water supply line valve. A separate drain under control of a dedicated valve may be provided to collect the chamber cleaning chemical and rinse water. Generally, the flow of drain liquid from the chamber is controlled by a combination of the solution return line valve and a cleaning chemical return line valve under direction of the controller. The collected cleaning chemical may be sent to a chemical recovery processing unit for recovery of chemical ingredients.

Figure 3:
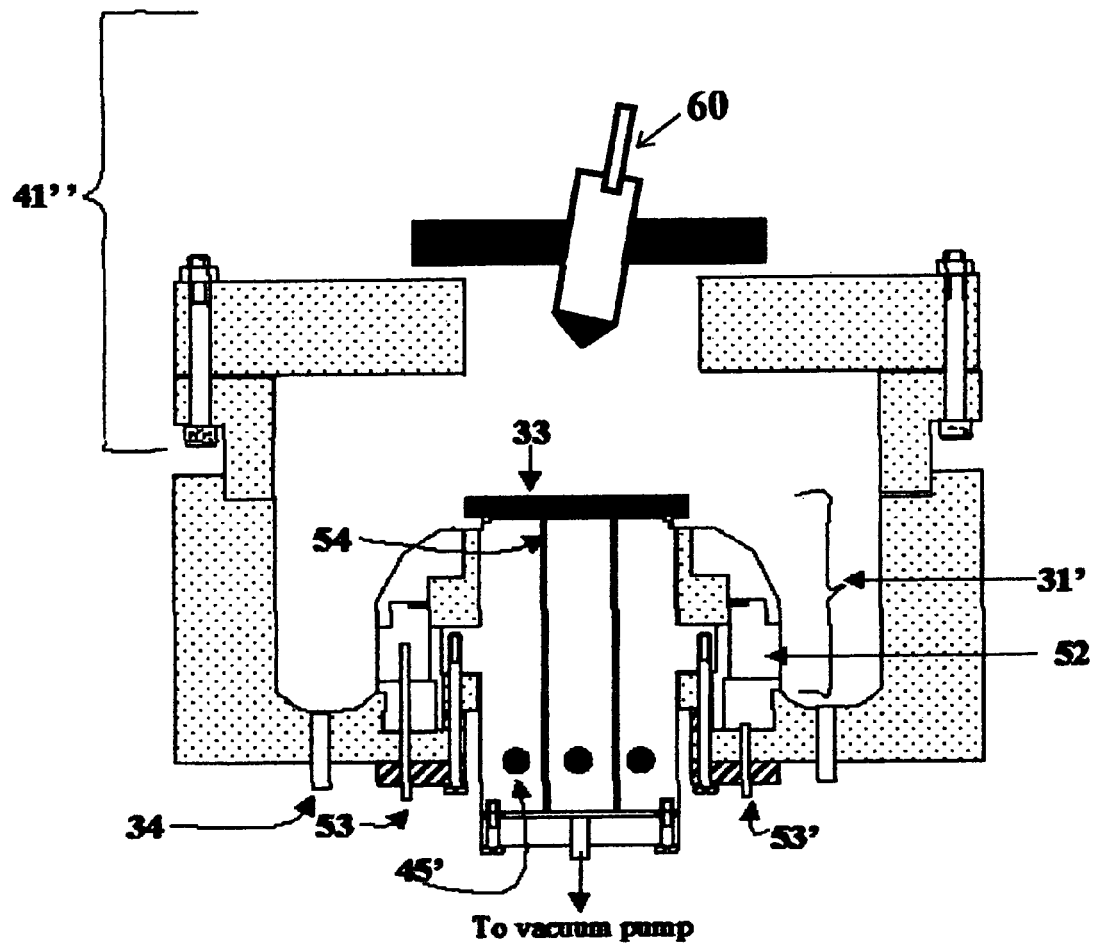
FIG. 3 illustrates schematically a vertical section of a chemical bath deposition chamber in accordance with another aspect of the present invention.

FIG. 3 depicts a cross-sectional view of another embodiment of the FGS reaction chamber taken along its vertical centerline. This chamber, modified to carry out the VPSPEED method, differs from that shown in FIG. 2 in several respects. First, showerhead assembly 41" includes a nebulizer 60, which is preferably movable to some degree, configured to deliver a fine mist of reagent solution to substrate 33. Nebulizers may be of various designs. One suitable type is the air-assisted nebulizer such as the Mira Mist nebulizer [Burgener Research, Inc., 944 Meadow Wood Rd., Mississauga, Ontario, Canada, L5J 2S6]. Another suitable type is the ultrasonic-assisted nebulizer such as the Impact precision sprayer [Sono-Tek Corp., 2012 Route 9W, Milton, N.Y. 12547]. The ring structure 51 shown previously in FIG. 2 may be eliminated because Applicant contemplates that the nebulizer will deliver a substantially lower quantity of reagent solution and there is consequently no need to provide a structure to retain or impound a significant quantity of reagent solution on the substrate surface during the VPSPEED deposition step.

Depending on the specific process, the substrate can be heated to some desired temperature during the deposition process. A feature of the invention is that the film growth rate in the FGS is exponentially dependent upon temperature, and it is therefore beneficial to keep only the substrate at a high temperature while chamber surfaces are kept at a low temperature for efficient, selective deposition. It will be understood by those skilled in the art, in view of several Examples that follow, that the reagent solution delivered during the LPSPEED phase of the process will generally be of a different composition than the reagent solution delivered during the VPSPEED phase of the process. Consequently, it is preferable in many cases for the heated platen to hold the substrate at one temperature for the VPSPEED operation and a second temperature for the LPSPEED operation. In both cases, the substrate is held at a higher temperature than that of the respective reagent solution being dispensed through the showerhead or atomizer.

Applicant contemplates that in many applications, the VPSPEED phase will be carried out first, followed by the LPSPEED phase. However, Applicant does not intend to limit the invention to any particular order of the process steps, and the skilled artisan may determine through routine experimentation that for some particular application the LPSPEED stage may be performed first, followed by the VPSPEED stage, or indeed that the two stages may be carried out iteratively in order to create more complicated compositionally modulated structures.

FIG. 2 shows an example in which the showerhead 41' is substantially fixed in position relative to the substrate holder assembly 31. It will be appreciated that in other contemplated embodiments, it might be desirable to use a moving, rotating, or oscillating showerhead as another means of ensuring uniform flow of process liquid over the entire substrate surface. Skilled artisans can easily add such modifications without undue experimentation using electric motors, mechanical linkages and the like as are well known in the art.

Figure 4:
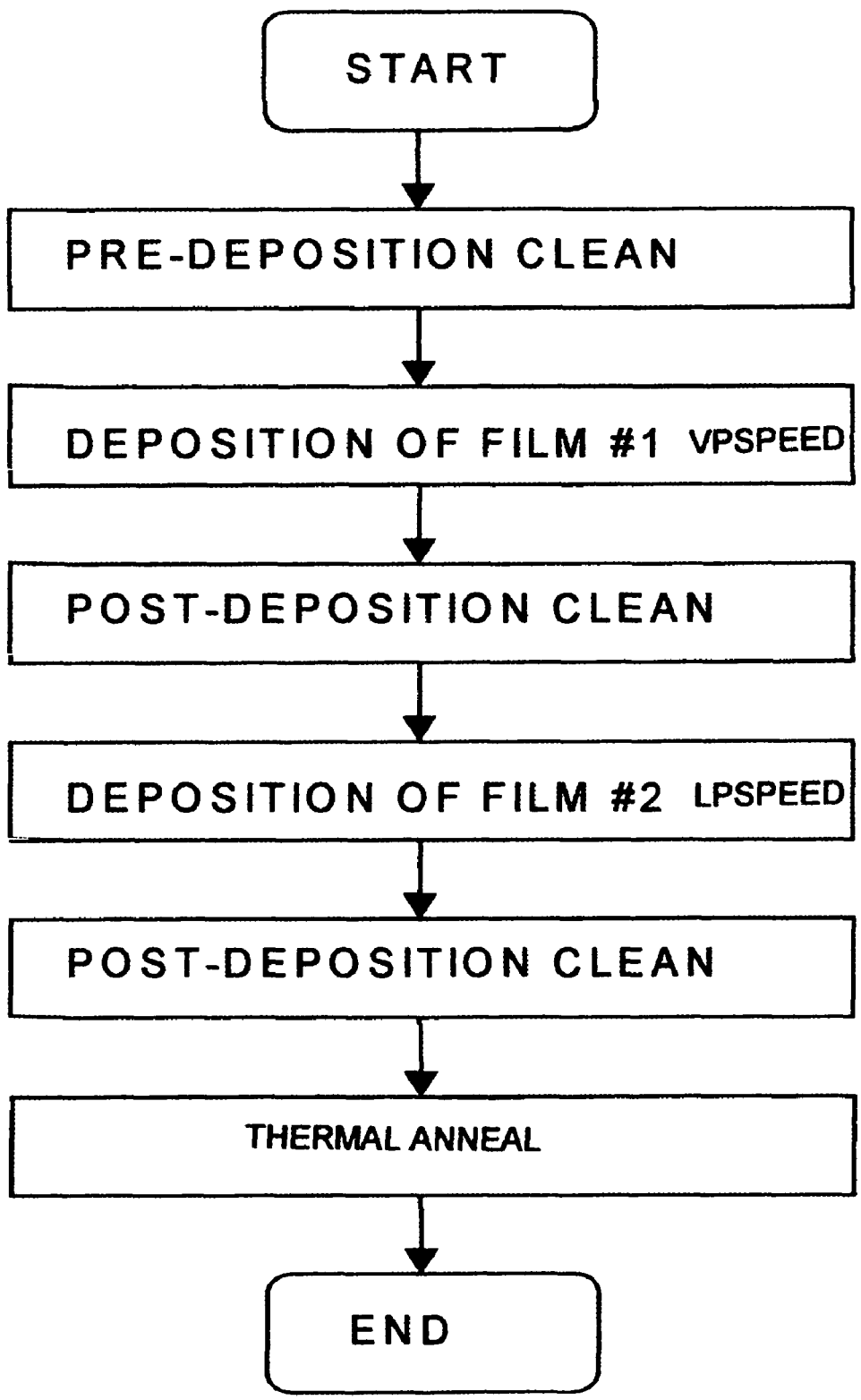
FIG. 4 presents a process flow diagram for a two-layer film stack prepared according to one aspect of the invention.

In the Examples that follow, more than one layer of semiconductor material may be formed on a substrate by a sequence of chemical processes. Referring to FIG. 4, there is shown a flow chart of exemplary steps that sequentially place multiple layers of material on the substrate. Formation of two layers in a sequence may include a clean step for removing contaminants from the substrate surface, followed by formation of a first layer. Next, a first post-film formation clean step may be performed for removing residual chemicals from the substrate surface, followed by a step for forming a second film layer different from the first layer. This may be followed by a second post-film formation clean step for removing residual chemicals from the substrate surface. In the pre-film formation clean step, a substrate placed on the substrate holder assembly inside the chamber may be cleaned with a first cleaning solution, rinsed with de-ionized (DI) water, and dried, for example, by a spin drying method as is common in semiconductor device manufacturing. Next, a first semiconductor layer is formed along the surface of the substrate, followed by a postfilm formation clean wherein the substrate may be cleaned with a second cleaning solution, rinsed with DI water for a suitable duration and dried. For multi-layer film formations, a system comprising a plurality of process chambers and a substrate handling robot can offer high operation efficiency and throughput resulting in a relatively low equipment cost per film layer. A single robot may provide substrate handling for multiple processing chambers.

The exemplary film growth systems described in FIGS. 1-4 may be used to form films comprising any of a wide range of materials, including metals, semiconductors, and insulators on a temperature-controlled substrate from constituents in a solution by series of reactions which are performed while controlling one or more of: the substrate temperature, the chamber pressure, the flow rate of the processing solution, the pH and the composition of the solution. For materials of particular interest for photovoltaic applications, a general process sequence may be described as follows.

The VPSPEED system is used to deposit a first layer consisting of AC or (AB)C where A is In, Ga, Sn, Sb, Fe, Al, etc.; (AB) is (InGa), (InAl), (ZnSn), (CdSn), etc.; and C is S or Se or the combination of these two elements.

Then the LPSPEED system is used to deposit a CuS layer on top of the first layer. During the liquid phase deposition of CuS, thermal and chemically induced diffusion and ion exchange can take place between the CuS and the first layer. This phenomenon leads to in situ formation of CuAC or Cu(AB)C as the case may be. The excess of flowing reagent during the LPSPEED step provides a further benefit by allowing the washing away of unwanted elemental residues in the VPSPEED deposited layer that often impair the electrical properties of pure spray deposited films.

To complete the homogenization of the deposited CuAC or Cu(AB)C film, the film may be subjected to rapid thermal anneal (RTA) at a temperature of 200-250° C. in $N_2$/Ar atmosphere for about 5 to 10 minutes.

The film may be further subjected to flash anneal or RTA anneal at a temperature ranging between 300 to 500° C. for about 1 to 10 minutes in Ar/$N_2$ atmosphere to increase the grain sizes and improve the film's electrical transport properties.

The bandgap of these materials could also be graded; this generally correlates with Cu-rich (for low bandgap) or Cu-poor (high bandgap) part of the film. To make the part of the film adjacent to the substrate Cu-rich, a thin CuS layer may deposited before the depositing the AC or (AB)C first layer; and to have a Cu-poor region at the surface of the film an additional layer of AC or (AB)C is deposited after the CuS deposition.

The precursors for VPSPEED deposition are preferably the nitrate, acetate, sulphate, or chloride salt of the metal or metals of interest, and thiourea or selenourea or the combination of the two for S or Se source respectively. The solvent is preferably deionized water with 10 to 90% ethanol, acetone, or other suitable organic solvent. The presence of organic solvent serves to further ensure that the reagent mist droplet sizes are preferably less than 50 μm and more preferably less than about 20 μm for the most uniform film deposition. During this deposition the substrate is preferably held at a temperature ranging between room temperature and about 200° C.

The precursors for LPSPEED deposition are preferably as described in Applicant's co-pending U.S. patent application Ser. No. 12/151,562. The reagent solution comprises the salt of the metal or metals of interest, at least two ligands, and thiourea or selenourea as the S or Se source in the deionized water medium at the appropriate pH. Growth takes place on the substrate held at temperature that is preferably more than about 100° C.

Some specific examples that follow will provide a fuller understanding of the invention with particular emphasis on its application to photovoltaic materials.

Example

Figure 5:
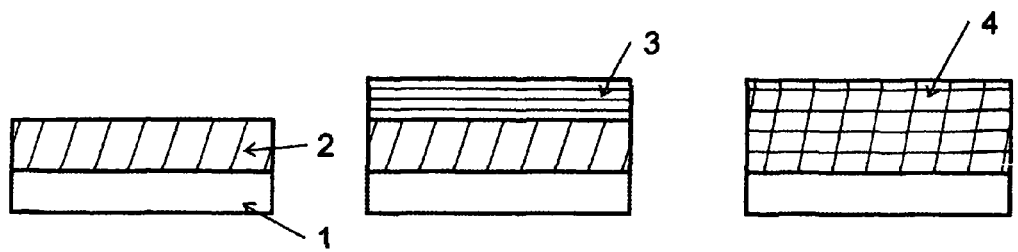
FIG. 5 illustrates schematically the formation of a single-phase Cu-containing semiconductor film via the deposition of two separate films according to one aspect of the invention.

FIG. 5 shows schematically the formation of CuAC or Cu(AB)C film having the chalcopyrite structure. In the first step, a desired thickness of AC or ABC compound 2 is formed on substrate 1, preferably by VPSPEED or other spray-based technique. In the next step, a corresponding thickness of CuC layer 3 is deposited by LPSPEED to achieve the desired stoichiometry. The target compound CuAC or Cu(AB)C, layer 4, is formed during the deposition of layer 3.

Example

Figure 6:
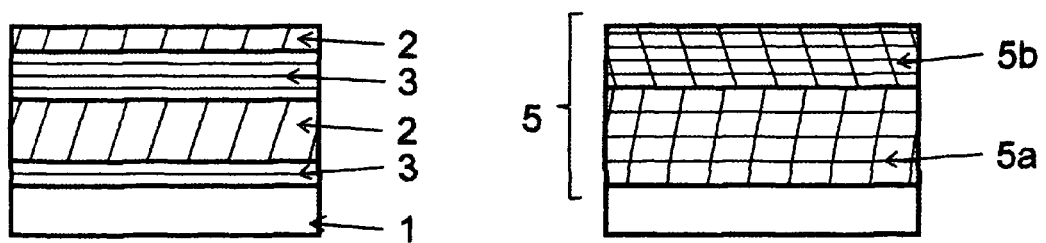
FIG. 6 illustrates schematically the formation of a film with a graded bandgap according to one aspect of the invention.

FIG. 6 illustrates schematically the formation of a CuAC or Cu(AB)C film with a graded bandgap. In the first step, a thin layer 3 of CuC is deposited on substrate 1. A layer 2 of AC or (AB)C is then deposited, followed by another layer 3 of CuC. Lastly, a thin layer 2 of AC or (AB)C is deposited. Homogenization, either during film growth or during a post-deposition anneal, creates a graded layer 5 comprising two sublayers, 5a and 5b. Sublayer 5a is Cu-rich with a relatively lower bandgap and sublayer 5b is Cu-poor with a relatively higher bandgap.

Example

A CuInS film was grown on a Mo-coated stainless steel substrate in two steps. First, InS was deposited by VPSPEED using a reagent solution consisting of: $InCl_3$ 0.005M, thiourea 0.0075M in 1:1 ethanol-de-ionized water solution. The reagent solution was maintained at 15° C. and sprayed onto the substrate in an atomized mist (average droplets were about 20 μm) while the substrate was held at about 150° C. Then, a layer of CuS was deposited on top of the InS film by LPSPEED using an aqueous reagent solution consisting of: copper sulfate 0.005M, triethanolamine 0.09M, citric acid 0.125M, nitriotriacetic acid 0.03M and thioacetamide 0.008M. This reagent solution was maintained at 15° C. and dispensed onto the InS-coated substrate, which was held at about 120° C. The complete grown film was then annealed in Ar/$N_2$ ambient at about 210° C. for about 10 minutes.

SIMS analysis of the resulting 0.5 μm thick film showed good homogeneity, and XRD analysis indicated that the predominant crystalline phase was $CuIn_5S_8$, which is one of the phases of interest for photovoltaic applications.

Example

A graded film consisting predominantly of the phase $Cu_2ZnSnS_4$ was deposited on Mo-coated stainless steel in the sequence CuS—SnZnS—CuS—SnZnS. For VPSPEED SnZnS deposition, the reagent solution consists of $SnCl_3$ 0.0025M, zinc nitrate 0.0025M, and thiourea 0.0075M in 1:1 ethanol-de-ionized water solution maintained at 15° C.; tions, and the substrate kept at 160° C. For LPSPEED CuS deposition, the aqueous reagent solution consisting of copper sulfate 0.005M, triethanolamine 0.09M, citric acid 0.125M, nitriotriacetic acid 0.03M and thioacetamide 0.008M was used. This reagent solution was maintained at 15° C. and dispensed onto the heated substrate, which was held at about 120° C. The complete grown film was then annealed in $Ar/N_2$ ambient at about 210° C. for about 10 minutes.

Figure 7:
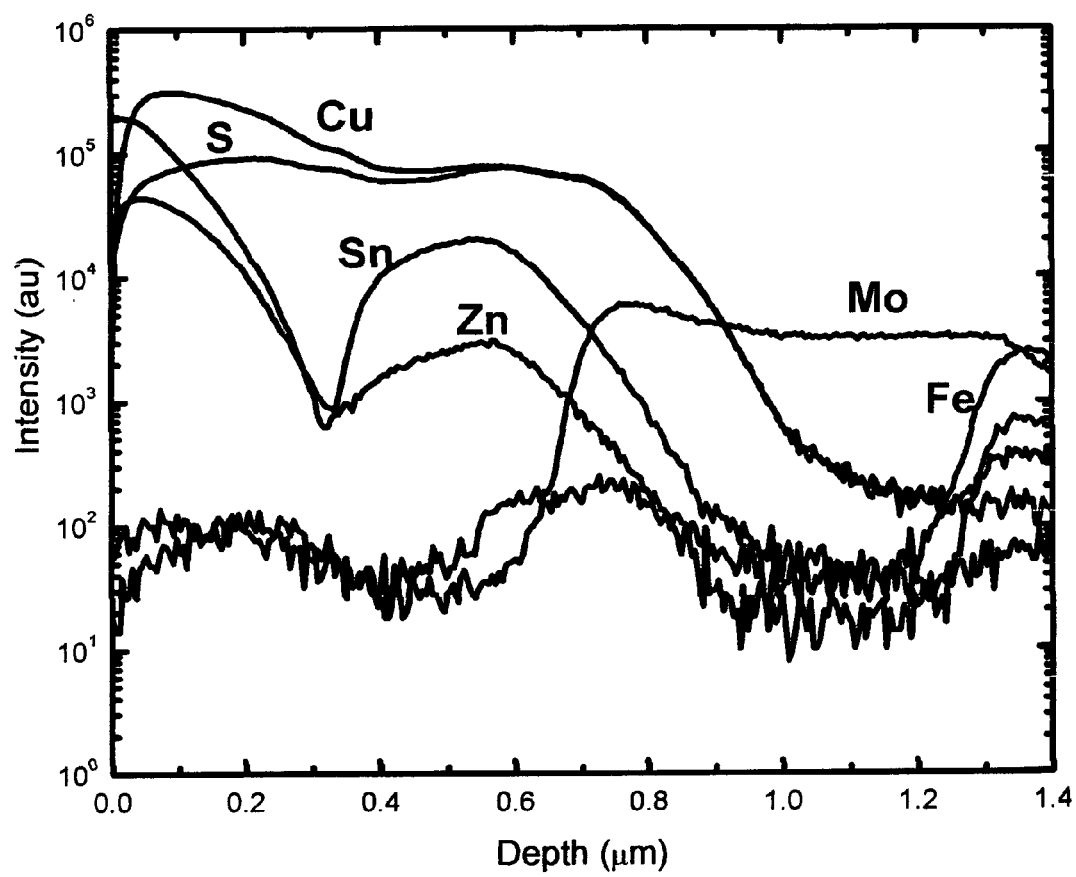
FIG. 7 presents a SIMS depth profile of a CuZnSnS film prepared by the inventive method.

The resulting film, about 0.8 μm thick, was analyzed by SIMS and the depth profile is shown in FIG. 7. It can be seen that Cu and S are fairly uniformly distributed throughout the film, whereas Sn and Zn concentrations vary significantly. The ratios of these concentrations can therefore be manipulated to grade the bandgap of the film.

SEM analysis indicated that the film had a nanocrystalline structure, consistent with the diffuse XRD pattern of the sample. It is expected that an appropriate thermal anneal could be used to recrystallize the film and induce further grain growth to improve the overall electronic properties of the film.

Those skilled in the art of semiconductors will appreciate that grading the composition of a film in the direction normal to the substrate can influence a number of electronic properties besides the bandgap. Some of these properties include the concentrations of carriers such as electrons and holes, and their respective mobilities, as well as the electrical conductivity or resistivity of the film.

Some compound semiconductors for which the inventive technique may be used include the following in any stoichiometry: CuSbS, CuSbSSe, CuInSSe, CuSnZnSe, CuInGaSSe, CuInGaS, CuAlS, CuAlSSe, CuFeS, CuFeSSe, CuLiS, CuLiSSe, CuGaS, CuGaSSe, CuSnS, CuSnSSe, CuZnS, CuZnSSe, CuAlMgS, CuAlMgSSe, CuCdS, CuCdSSe, CuCdSnS, CuCdSnSSe, etc. Through routine experimentation the skilled artisan can modify the various recipes and procedures taught herein to accommodate other metals, adding them for example as nitrates, chlorides, acetates, sulfates or other soluble species.

Although numerous examples of the invention have been illustrated and described, the invention is not so limited. Numerous modifications, variations, substitutions and equivalents will occur to those skilled in the art without departing from the spirit and scope of the present invention.

I claim:

1. An apparatus for depositing a solid film onto a substrate from reagent solutions comprising:
    a reservoir of a first reagent solution maintained at a first temperature at which homogeneous reactions are substantially inhibited within said first reagent solution;
    a first showerhead assembly including a nebulizer configured to dispense said first reagent solution as a fine mist at said first temperature;
    a reservoir of a second reagent solution maintained at a second temperature at which homogeneous reactions are substantially inhibited within said second reagent solution;
    a second showerhead assembly configured to dispense said second reagent solution as a flowing stream at said second temperature;
    a substrate holder configured to hold said substrate in a position to receive, in sequence, at least a portion of said fine mist of said first reagent solution and at least a portion of said flowing stream of said second reagent over a selected area of said substrate, said substrate holder further including a raised structure peripheral to said selected area whereby a controlled volume of said second reagent solution may be maintained upon said substrate and replenished at a selected rate; and,
    a heater disposed beneath said substrate, said heater configured to maintain said substrate at a selected temperature, higher than at least one of said first and second temperatures, at which the deposition of a desired solid phase from said first and said second reagent solutions respectively may be initiated.

2. The apparatus of claim 1 wherein said selected temperature is at least 60° C. higher than at least one of said first and said second temperatures.

3. The apparatus of claim 1 wherein said first showerhead assembly is configured to dispense said first reagent solution as a mist having an average droplet size less than about 50 μm.

4. The apparatus of claim 1 wherein said second showerhead assembly is configured to dispense a first portion of said second reagent solution into said controlled volume defined by said raised peripheral structure and to dispense a second portion of said reagent solution outside of said controlled volume.

5. The apparatus of claim 1 further comprising a process chamber containing said showerhead assemblies, said substrate holder, and said heater.

6. The apparatus of claim 5 wherein at least a portion of said second reagent solution follows a recirculating path between said process chamber and said second reagent solution reservoir.

7. The apparatus of claim 6 wherein at least one of said first and second reagent solution reservoirs includes a device selected from the group consisting of: temperature sensors, pH meters, chemical sensors, liquid level control switches, and chillers.

8. The apparatus of claim 6 wherein said recirculating path includes a device selected from the group consisting of: pumps; valves; filters; pressure gauges; and return line reservoirs.

9. The apparatus of claim 5 wherein said process chamber may be maintained at a selected pressure.

* * * * *